United States Patent
Frede

(10) Patent No.: US 11,531,045 B2
(45) Date of Patent: Dec. 20, 2022

(54) MEASUREMENT APPARATUS AND METHOD FOR CONTROLLING A MEASUREMENT APPARATUS

(71) Applicant: Rohde & Schwarz GmbH & Co. KG, Munich (DE)

(72) Inventor: Tobias Frede, Gröbenzell (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 399 days.

(21) Appl. No.: 16/661,547

(22) Filed: Oct. 23, 2019

(65) Prior Publication Data

US 2021/0123952 A1 Apr. 29, 2021

(51) Int. Cl.
*G06V 40/13* (2022.01)
*G01R 13/22* (2006.01)

(52) U.S. Cl.
CPC ......... *G01R 13/22* (2013.01); *G06V 40/1306* (2022.01)

(58) Field of Classification Search
CPC .............................. G01R 13/22; G06K 9/0002
See application file for complete search history.

(56) References Cited

U.S. PATENT DOCUMENTS

| 2011/0175703 A1* | 7/2011 | Benkley, III | G06V 40/1306 340/5.82 |
| 2014/0359757 A1* | 12/2014 | Sezan | G06F 21/32 726/19 |
| 2018/0373913 A1* | 12/2018 | Panchawagh | G01S 7/52079 |
| 2020/0106769 A1* | 4/2020 | Ramian | H04L 63/0428 |

FOREIGN PATENT DOCUMENTS

| KR | 20170094895 A * | 8/2017 | .......... G06K 9/00013 |
| WO | 2014/197504 A1 | 12/2014 | |
| WO | WO-2014197504 A1 * | 12/2014 | .............. G01N 29/22 |
| WO | WO-2019072910 A1 * | 4/2019 | ............ G06F 16/245 |

OTHER PUBLICATIONS

Machine translation of KR 20170094895 A (Year: 2017).*

* cited by examiner

*Primary Examiner* — Natalie Huls
*Assistant Examiner* — James I Burris
(74) *Attorney, Agent, or Firm* — Westman, Champlin & Koehler, P.A.

(57) ABSTRACT

A measurement apparatus and a method for controlling a measurement apparatus is provided. The measurement apparatus comprises an ultrasonic sensor for receiving a further user input. The further user input may be used to identify a specific user. Accordingly, the measurement apparatus can be automatically configured based on data related to the identified user. Since the ultrasonic sensor may be operated even if the ultrasonic sensor is covered by a protecting element, the robustness of the measurement apparatus can be further improved.

12 Claims, 2 Drawing Sheets

MEASUREMENT APPARATUS AND METHOD FOR CONTROLLING A MEASUREMENT APPARATUS

TECHNICAL FIELD

The present invention relates to a measurement apparatus. The present invention further relates to a method for controlling a measurement apparatus.

BACKGROUND

Although applicable in principle to any measurement apparatus, the present invention and its underlying problem will be hereinafter described in combination with a portable test device such as an oscilloscope.

Measuring devices may be used for measuring any kind of signals, in particular electrical signals. For example, the electrical signals may be signals measured from a device under test. Furthermore, a measuring device may generate a number of one or more test signals, which may be provided to a device under test for testing purposes. For operating such measuring devices, one or more parameters of the measuring device have to be configured in order to operate the measuring device. Furthermore, the acquired measurement signals may be provided in an appropriate specific manner. For this purpose, each user may configure the measuring device depending on its individual needs. Furthermore, various users may have different rights for operating or configuring the measuring device.

Against this background, a problem addressed by the present invention is to provide a measurement apparatus, which can be configured and controlled in a simple and reliable manner. Furthermore, the present invention aims to provide a measurement apparatus, which can be reliably operated even under harsh conditions.

SUMMARY

The present invention solves this object by a measurement apparatus and a method for controlling a measurement apparatus with the features of the independent claims. Further advantageous embodiments are subject-matter of the dependent claims.

According to a first aspect, a measurement apparatus is provided. The measurement apparatus comprises a measuring device, a user interface, an ultrasonic sensor and a housing. The measuring device is configured to receive a measurement signal. Additionally, or alternatively, the measuring device may be configured to output a test signal. The measurement signal and the test signal may be electrical signals. The user interface may be configured to provide an output of the measuring device. Additionally, or alternatively, the user interface may receive a first user input. The ultrasonic sensor may be configured to receive a second user input. The housing is configured to accommodate the measuring device, the user interface and the ultrasonic sensor.

According to a further aspect, a method for controlling a measurement apparatus is provided. The measurement apparatus may comprise a measuring device for receiving measurement signals and/or outputting test signals. The measurement apparatus may further comprise a user interface and an ultrasonic sensor. The ultrasonic sensor may be configured to receive a user input. The measuring device, the user interface and the ultrasonic sensor may be accommodated in a common housing. The method comprises a step of detecting a user input. The user input is detected by the ultrasonic sensor of the measurement apparatus. The method further comprises a step of controlling the measurement apparatus in response to the received user input. The controlling of the measurement apparatus may be performed by the ultrasonic sensor of the measurement apparatus.

The present invention is based on the finding that multiple users of a measurement apparatus may wish to have different settings of the measurement apparatus. Some users of a measurement apparatus may have different rights for configuring or operating the measurement apparatus. Furthermore, such a measurement apparatus may be operated, for instance in a test field, under rough conditions.

Thus, the present invention takes into account this finding and aims to provide a control of a measuring device for individually configuring and operating the measuring device according to the requirements of a current user. In particular, the present invention aims to provide a measurement apparatus, which can individually configure the measurement apparatus according to a specific user even under rough conditions, for instance in a test field or the like.

For this purpose, the present invention provides a measurement apparatus with an ultrasonic sensor. In particular, this ultrasonic sensor may receive a specific user input. For example, the user input received by the ultrasonic sensor may be used to identify the respective user. Accordingly, the configuration of the measurement apparatus may be set according to the user input received by means of the ultrasonic sensor. For example, the ultrasonic sensor may identify a characteristic feature of a user. According to the specific feature of the user, it may be possible to identify a user and to configure the measurement apparatus accordingly. In this way, the measurement apparatus may be configured automatically according to the requirements of a user and/or the rights, which has been granted to a specific user for controlling the measurement apparatus.

Ultrasonic sensors are able to receive signals even under difficult conditions. For example, ultrasonic sensors may be able to operate correctly even if the environment of the measurement apparatus is dirty, dusty or the like. In this way, a reliable input from a user can be received under such difficult conditions. Hence, it is possible to operate the measurement apparatus in a rough environment. Accordingly, the robustness of the measurement apparatus can be improved. Furthermore, the reliability of controlling the measurement apparatus based on user inputs received by means of the ultrasonic sensor can be enhanced.

The ultrasonic sensor may be any kind of sensor for obtaining information from a user based on ultrasonic waves. For example, the ultrasonic sensor may comprise an emitter for emitting ultrasonic waves, and a receiver for receiving ultrasonic waves in a frequency range corresponding to the frequency range of the emitted ultrasonic waves. Accordingly, the emitted ultrasonic waves may be reflected by an object, and the reflected ultrasonic waves may be received by the receiver of the ultrasonic sensor. Accordingly, by measuring the period of time between a transmission of ultrasonic waves and the reception of the reflected waves, the ultrasonic sensor may determine characteristic information about the object in the environment of the ultrasonic sensor, for example a distance between the ultrasonic sensor and the object. However, it is understood that the ultrasonic sensor may perform an even more complex analysis. For example, the ultrasonic sensor may analyze two or three dimensional structures in the scanning area of the ultrasonic sensor. For example, the ultrasonic sensor may be an ultrasonic sensor for acquiring three-dimensional information relating to an object in a scanning area of the sensor.

Accordingly, a user may place an appropriate object in the scanning area of the ultrasonic sensor, and the ultrasonic sensor may acquire a user input according to the position and/or characteristic properties of the object. For example, the object may be an object having a unique characteristic. For instance, the object may be a finger of a user. Accordingly, a fingerprint of the user may be acquired for identifying the user. However, it is understood, that any other kind of information may be acquired for receiving a user input by means of the ultrasonic sensor.

The ultrasonic sensor may be arranged in a housing of the measurement apparatus. Accordingly, the ultrasonic sensor may be protected against dust and dirt and further disturbances by means of the housing. Since an ultrasonic sensor may even perform a scanning through a wall of the housing, the ultrasonic sensor may be protected in a very reliable manner against disturbances due to dirt and dust.

Furthermore, the housing may also accommodate additional components such a measuring device and a user interface of the measurement apparatus. Accordingly, all sensitive components may be covered by the housing and protected against dust and dirt.

The measuring device of the measurement apparatus may be any kind of measuring device for measuring signals and/or generating signals. For example, measuring device may receive one or more electric signals and acquire measurement data based on the received measurement signals. For this purpose, the measuring device may comprise any kind of appropriate components such as analogue-to-digital converters, amplifiers, attenuators, filters or the like. Furthermore, one or more test signals may be generated, which can be applied to a device under test. For example, the test signals may be signals having a constant voltage or a specific waveform. In particular, the test signals may be signals with a specific frequency, modulation, etc. For this purpose, the measuring device may comprise a signal generator, mixer, amplifier, attenuator, coupler etc.

The user interface of the measurement apparatus may receive measurement data from the measuring device and provide the data to a user. For example, the measurement data may be provided to a user by means of a graphical representation on a display. Furthermore, the user interface may have any other kind of optical or acoustical output device. Furthermore, the user interface may comprise any kind of input device for receiving further user input. For example, the user interface may comprise a touch-screen for receiving a touch or a gesture from a user. The user interface may also comprise keys or knobs or any other kind of input element for receiving further user input. It is understood, that the user interface of the measurement apparatus is not limited to the abovementioned examples. Furthermore, the user interface may comprise any kind of interface for outputting and/or inputting data to/from a user.

Further embodiments of the present invention are subject of the further sub-claims and of the following description, referring to the drawings.

In a possible embodiment, the housing is configured to shield the measuring device and the user interface against electromagnetic interferences.

For example, the housing may comprise walls of electrically conductive materials such as metal, for example aluminum or the like. It may be also possible that the housing of the measurement apparatus may be coated with an electrically conductive material. In this way, the components of the measurement apparatus, in particular the measuring device and the related components such as the user interface and the ultrasonic sensor may be protected against disturbances due to electromagnetic interferences. Hence, the reliability of the operation can be improved and malfunctions can be avoided.

In a possible embodiment, the ultrasonic sensor is configured to detect a fingerprint of a user.

For example, the ultrasonic sensor may perform a two- or three-dimensional scanning of objects in the scanning area of the ultrasonic sensor. In this way, structures of a fingerprint of a finger of the user can be detected. Based on the detected fingerprint, a user can be identified in a reliable manner. In particular, an ultrasonic sensor may even detect a fingerprint if the finger of a user is covered by gloves, or if the finger of the user is wet or dirty. Accordingly, a reliable identification of a user can be even achieved under rough conditions.

In a possible embodiment, the ultrasonic sensor comprises a fingerprint memory. The fingerprint memory may be configured to store a number of datasets, wherein each dataset relates to data of a specific user. In particular, each dataset may provide data of one or more fingerprints of a specific user.

By providing multiple datasets of fingerprints for a number of users, the respective users can be easily identified by comparing the fingerprint acquired by the ultrasonic sensor with the data stored in the fingerprint memory. In this way, the related user can be easily identified, and the control of the measuring device can be applied accordingly.

In a possible embodiment, the ultrasonic sensor comprises a switch. The switch may be configured to switch the measurement apparatus on or off. In particular, the switch may switch the measurement apparatus on or off if the ultrasonic sensor identifies a predetermined user.

By using the ultrasonic sensor for switching the measurement apparatus on and off, the measurement apparatus can be operated by means of a very robust control element. As already explained above, the ultrasonic sensor is very robust against impacts due to dust or dirt. Further to this, the ultrasonic sensor may provide a contactless identification of a user or other elements in the scanning area of the ultrasonic sensor. Hence, it is possible to switch the measurement apparatus on and off without physically touching the measurement apparatus. In this way, abrasion or damage of the elements for switching the measurement apparatus on and off can be reduced.

In a possible embodiment, the ultrasonic sensor comprises a configuration memory. The configuration memory may be configured to store user specific measurement data. Additionally, or alternatively, the configuration memory may store specific configuration data of the measuring device. The ultrasonic sensor may be configured to initialize the measurement apparatus based on stored user specific measurement data and/or user specific configuration data, if the received second user input by means of the ultrasonic sensor relates to an identified user.

The ultrasonic sensor may receive any kind of second user input for identifying a user. Accordingly, after identifying a specific user based on the received user input by means of the ultrasonic sensor, the ultrasonic sensor may automatically initialize the measurement apparatus, in particular the measuring device, based on the respective data relating to the identified user. In this way, the measurement apparatus can be automatically initialized according to the needs or the rights for the respective user. Thus, the time period for setting and configuring the measurement apparatus can be decreased.

In a possible embodiment, the ultrasonic sensor is configured to start the measurement apparatus in a default mode if the received second user input does not relate to an identified user.

Accordingly, it is possible to start the measurement apparatus in a standard configuration, even if the ultrasonic sensor does not identify a specific user. In this way, the operation of the measurement apparatus is not limited only to prestored users. Furthermore, any user may operate the measurement apparatus at least in a default mode.

In a possible embodiment, the ultrasonic sensor is arranged behind a glass panel. Alternatively, the ultrasonic sensor may be arranged behind a metal cover of the housing.

As already mentioned above, an ultrasonic sensor may even perform a scanning through cover elements such as glass or (thin) metal. In this way, the ultrasonic sensor may be reliably covered. Accordingly, the ultrasonic sensor is protected against disturbances such as dust or dirt. Hence, the reliability of the operations by a control of the measurement apparatus by means of user input through the ultrasonic sensor can be improved.

In a possible embodiment, the ultrasonic sensor may be located underneath the housing.

By arranging the ultrasonic sensor underneath the housing, the ultrasonic sensor can be easily accessed. Accordingly, on the one-hand side a user may easily provide input in the scanning area of the ultrasonic sensor. On the other hand-side it is easily possible to access the ultrasonic sensor for replacement in case of a malfunction. In this way, the time of availability of the measurement apparatus can be improved.

In a possible embodiment, the measurement apparatus may be a portable or movable measurement apparatus.

For example, the measurement apparatus may be an oscilloscope, a spectrum analyzer, a signal generator or any other kind of portable/movable device. As already mentioned above, the measurement apparatus according to the present invention can be used in rough, dirty and wet industry environment. Thus, even if such a portable measuring device is operated in a test field, the measurement apparatus provides robust operation properties.

With the present invention it is therefore possible to operate and/or configure a measurement apparatus by an ultrasonic sensor. As already explained, ultrasonic sensors may be even possible to operate behind a protective member such as a glass or metal cover. Accordingly, the ultrasonic sensor may acquire user input in a rough, dirty and wet environment. Hence, the robustness and the reliability of the measurement apparatus can be improved. Further, the ultrasonic sensor may even acquire unique and/or user specific information. Accordingly, the measurement apparatus may be configured individually for multiple users based on the obtained unique information.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
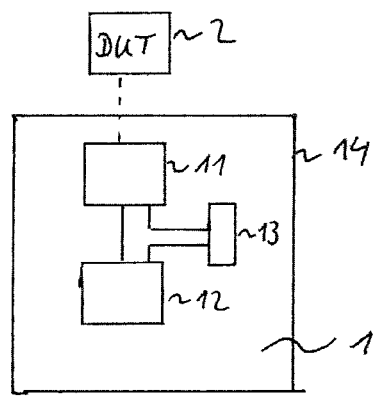
FIG. 1 shows a block diagram of an embodiment of a measurement apparatus according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a measurement apparatus 1 according to an embodiment. Measurement apparatus 1 may comprise at least a measuring device 11, a user interface 12 and an ultrasonic sensor 13. The measuring device 11, the user interface 12 and the ultrasonic sensor 13 may be accommodated in a common housing 14. The common housing 14 may cover the components 11, 12, 13 of the measurement apparatus 1 and shield these components against moisture, dust, dirt or the like. It may be even possible that housing 14 may be a completely closed housing. Furthermore, housing 14 may also shield the components 11, 12, 13 of the measurement apparatus 1 against electromagnetic disturbances. For this purpose, housing 14 may be a metallic housing, for example a housing comprising sheet metal or the like. Alternatively, housing 14 may be covered by an electrically conductive material.

Measuring device 11 may be any kind of device for receiving one or more electrical signals from a device under test 2. Additionally, or alternatively, measuring device 11 may output any kind of electrical signal. For example, measuring device 11 may be an oscilloscope, a signal generator, a spectrum analyzer, a network analyzer, a voltmeter, a mobile radio tester or any other kind of device for measuring electrical signals and/or generating and outputting electrical signals.

Measuring device 11 may be configured, for example, by means of user interface 12. For example, user interface 12 may receive input from a user by means of keys, knobs, buttons, a touch-screen or any other kind of input elements. For example, a user may configure measuring device 11 by entering specific commands, values or the like.

Further to this, user interface 12 may provide output for indicating a current configuration of measurement apparatus 1 for testing device under test 2. In particular, measuring device 11 or any other component of the measurement apparatus 1. User interface 12 may also output measurement results of measuring device 11. For example, one or more signal waveforms may be displayed on a display. However, it is understood, that any other kind of measurement results may be also provided to a user by means of user interface 12. The measurement results may relate to current measurements or previously acquired measurements, which have been stored in a memory (not shown) of measuring device 11. Further to this, user interface 12 may also output any other kind of data to a user and/or receive any other kind of user input from a user for operating or controlling measurement apparatus 1.

As already mentioned above, measurement apparatus 1 further comprises an ultrasonic sensor 13. Ultrasonic sensor 13 may acquire further input from a user. In particular, the further input of the user may be acquired by means of ultrasonic waves. For this purpose, ultrasonic sensor 13 may emit ultrasonic waves. The emitted ultrasonic waves may be reflected by an object. The reflected ultrasonic waves may be received by ultrasonic sensor 13. By analyzing the time period between the transmission and the reception of the ultrasonic waves and further analyzing the properties of the received ultrasonic waves, ultrasonic sensor 13 may obtain information relating to an object in the scanning area of the ultrasonic sensor 13. In particular, ultrasonic sensor 13 may acquire two-dimensional or three-dimensional information about an object in the scanning area of ultrasonic sensor 13.

Since modern ultrasonic sensors may provide a very fine resolution, it may be even possible to scan fine details such as fingerprints or the like. Accordingly, if a user puts a finger in the scanning area of ultrasonic sensor 13, ultrasonic sensor 13 may acquire a two- or three-dimensional scanning of the finger in order to acquire a fingerprint. In particular, it may be even possible to acquire data of a fingerprint through a glove or of a wet finger. However, the scanning of the ultrasonic sensor 13 is not limited only to acquiring fingerprints. Moreover, any kind of information can be acquired by scanning objects in the scanning area of ultrasonic sensor 13.

After obtaining further user information based on the scanning of ultrasonic sensor 13, the information acquired by ultrasonic sensor 13 may be used for controlling or configuring measurement apparatus 1. For example, a specific configuration of measuring device 11 and/or user interface 12 may be set depending on the further user information acquired by ultrasonic sensor 13. This will be described in more detail below.

Figure 2:
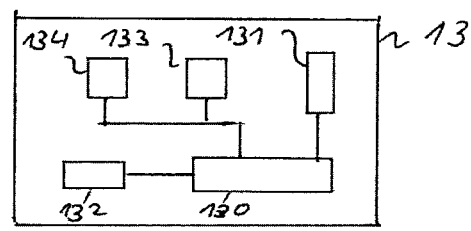
FIG. 2 shows a block diagram of ultrasonic sensor in a measurement apparatus according to an embodiment.

FIG. 2 shows a block diagram of an ultrasonic sensor 13 for a measurement apparatus 1 according an embodiment. For example, ultrasonic sensor 13 may comprise a sensor element 131. Sensor element 131 may perform a scanning of a predetermined scanning area by means of ultrasonic waves. Accordingly, scanning element 131 may perform a two-dimensional or three-dimensional scanning of objects in the scanning area of scanning element 131. The operation of scanning element 131 may be controlled, for example by a controller 130. For example, controller 130 may process the signals provided by scanning element 131 in order to obtain a two-dimensional or three-dimensional representation of the scanned object.

Ultrasonic sensor 13 may further comprise a fingerprint memory 133. For example, previously scanned fingerprints of a user may be stored in fingerprint memory 133. Thus, a currently scanned fingerprint may be compared with the data of previously scanned fingerprints in order to identify a specific user. In this way, a unique identification of a specific user can be achieved.

Even though the previously explanation describes an identification of a user based on a fingerprint, it may be also possible to identify a user based on any other kind of unique characteristics, which can be acquired by means of an ultrasonic scanning.

When a specific user has been identified, ultrasonic sensor 13 may issue one or more specific commands for controlling or initializing measurement apparatus 1. For example, ultrasonic sensor 13 may comprise a switch 132. For example, this switch 132 may be configured to switch on or off one or more elements of measurement apparatus 1. For example, switch 132 may switch on or off measuring device 11 and/or user interface 12. For this purpose, switch 132 may switch on or off the power supply for the related elements such as measuring device 11 or user interface 12. For example, when measurement apparatus 1 is powered on, measurement apparatus 1 is in a stand-by mode or the like. In this stand-by mode, ultrasonic sensor 13 may be active, while measuring device 11 and user interface 12 are switched off. After ultrasonic sensor 13 detects a specific user input, for example a fingerprint of a user, switch 132 is operated to activate measuring device 11 and user interface 12. However, it is understood, that any other scheme for switching on and off any of the devices of measurement apparatus 1 may be also possible.

Ultrasonic sensor 13 further may comprise a configuration memory 134. For example, configuration memory 134 may store specific configurations. In particular, the specific configuration stored in configuration memory 134 may relate to configurations of multiple different users. Accordingly, when a specific user is identified based on the user interface obtained by ultrasonic sensor 13, a related configuration may be read from configuration memory 134, and the respective configuration may be applied to measuring device 11 and/or user interface 12. In this way, a user can easily activate measurement apparatus 1 and start the measurement apparatus 1 in a specific configuration. For example, the specific configuration may be a configuration, which has been applied by the respective user when the measurement apparatus 1 has been switched off. Alternatively, a user may specify a specific configuration in advance, which should be applied automatically each time when the measurement apparatus 1 is switched on.

Further to this, configuration memory 134 may also store measurement results of previous measurement operations. For example, measurement results acquired by a specific user may be stored in configuration memory 134 when measurement apparatus 1 is switched off, and the respective measurement results are automatically loaded and output when the respective user switches on measurement apparatus 1. In this way, the user can automatically continue with his work after restarting measurement apparatus 1 based on the user input received by ultrasonic sensor 13.

Further to this, configuration memory 134 may also store specific rights. For example, an advanced configuration of measurement apparatus 1, in particular measuring device 11 may be limited only to a specific user or a specific group of users. Accordingly, the respective rights are only granted, if the respective user is identified based on the user input received by ultrasonic sensor 13.

In order to allow at least a limited operation to all users, in particular users, which have been not registered in advance, measurement apparatus 1 may be initialized with a specific default configuration if no specific user can be identified based on the user input obtained by ultrasonic sensor 13. For example, the default configuration may provide only limited access to at least some configurations. Alternatively, the measurement apparatus may initialized in a default configuration with specific standard values.

Figure 3:
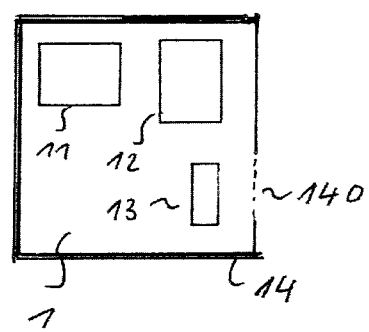
FIG. 3 shows a cross section through a measurement apparatus according to an embodiment.

FIG. 3 shows a cross-section of a measurement apparatus 1 according to an embodiment. As can be seen in FIG. 3, ultrasonic sensor 13 may be arranged inside housing 14 of measurement apparatus 1. In particular, measurement apparatus 13 may be protected by a shielding element 140. This shielding element 140 may be, for example, a glass panel or the like. Since ultrasonic sensor 13 may be able to scan objects through such a glass panel, it is possible to protect ultrasonic sensor 13 and all further components inside housing 14 against humidity, dust, dirt or the like. Furthermore, user interface 12 may be also arranged behind a glass panel. At least part of user interface 12, for example a display or the like, may be arranged behind a glass panel.

Alternatively, ultrasonic sensor 13 may be arranged behind a metal plate or the like. Since ultrasonic sensor 13 may be also able to acquire user input through thin metal plates, such a metal plate may be used to protect ultrasonic sensor 13 against disturbances such as dust or dirt.

Further to the configuration as illustrated in FIG. 3, it may be also possible to arrange ultrasonic sensor 13 underneath the housing 14. In this way, ultrasonic sensor 13 can be easily reached. Accordingly, ultrasonic sensor 13 can easily acquire user input. Further to this, ultrasonic sensor 13 can be easily replaced in case that ultrasonic sensor 13 breaks down.

Figure 4:
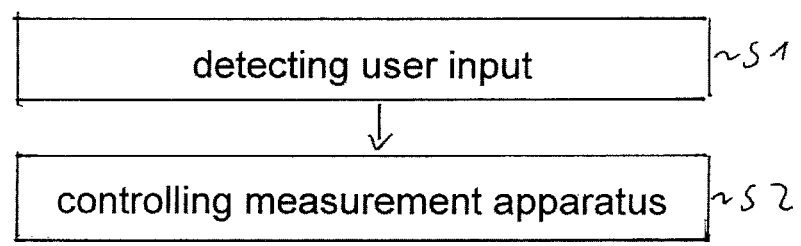
FIG. 4 shows a block diagram of an embodiment of a method according to the present invention.

FIG. 4 shows a flow diagram of a method for controlling a measurement apparatus 1 according to an embodiment. In particular, the method may be applied to a measurement apparatus 1 as already described above. Thus, all explanations in connections with FIGS. 1-3 also apply to the method according to FIG. 4. Furthermore, all explanations in connection with the method according to FIG. 4 also apply to measurement apparatus 1 as already described above.

In a first step S1, a user input may be detected by an ultrasonic sensor 13. In step S2, ultrasonic sensor 13 may control measurement apparatus 1 in response to the received user input.

The housing 14 of measurement apparatus 1 may shield the measuring device 11 and the user interface 12 against electromagnetic interferences.

In particular, the detecting of a user input may comprise detecting a fingerprint of a user.

The method may further comprise storing a number of datasets, each dataset relating to a data of a specific user. In particular, the datasets may be stored in a fingerprint memory of the ultrasonic sensor 13. The datasets may relate to data of fingerprints of a specific user.

The method may further comprise a step of switching the measurement apparatus 1 on and off. In particular, the measurement apparatus 1 may be switched on and off by a switch 132 of ultrasonic sensor 13.

The method may further comprise a step of storing user specific measurement data. Additionally, or alternatively, the method may comprise a step of storing user specific configuration data. The user specific measurement data and/or configuration data may be stored in a configuration memory 134 of ultrasonic sensor 13. Accordingly, the method may comprise a step of initializing the measurement apparatus 1 based on the user specific measurement data and/or the user specific configuration data. In particular, the initialization based on the respective data may be performed if the received user input relates to an identified user.

In particular, the ultrasonic sensor 13 may be arranged behind a glass panel or a metallic cover of the housing 14.

The ultrasonic sensor 13 may be located underneath the housing 14.

The measurement apparatus 1 may be a portable measurement apparatus or at least a measurement apparatus, which can be moved around.

Summarizing, the present invention relates to an improved measurement apparatus. The measurement apparatus comprises an ultrasonic sensor for receiving a further user input. The further user input may be used to identify a specific user. Accordingly, the measurement apparatus can be automatically configured based on data related to the identified user.

Since the ultrasonic sensor may be operated even if the ultrasonic sensor is covered by a protecting element, the robustness of the measurement apparatus can be further improved.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

1 measurement apparatus
2 device under test
11 measuring device
12 user interface
13 ultrasonic sensor
14 housing
130 controller
131 scanning element
132 switch
133 fingerprint memory
134 configuration memory
140 shielding element

The invention claimed is:

1. A measurement apparatus, comprising:
a measuring device for receiving a measurement signal and/or for outputting a test signal;
a user interface for providing an output of the measuring device;
an ultrasonic sensor for receiving a user input; and
a housing for accommodating the measuring device, the user interface and the ultrasonic sensor;
wherein the ultrasonic sensor is configured to detect a fingerprint of a user as user input for identifying the user;
wherein the ultrasonic sensor comprises a switch for switching on and off the measurement apparatus when the ultrasonic sensor detects a fingerprint of a user;
wherein the ultrasonic sensor comprises a configuration memory for storing user specific measurement data and/or user specific configuration data of the measuring device;
wherein the ultrasonic sensor is configured to initialize the measurement apparatus based on the user specific measurement data and/or the user specific configuration data when the received user input relates to an identified user;
wherein the ultrasonic sensor is configured to initialize the measurement apparatus in a default mode when the received user input does not relate to an identified user.

2. The apparatus of claim 1, wherein the housing is configured to shield the measuring device and the user interface against electromagnetic interferences.

3. The apparatus of claim 1, wherein the ultrasonic sensor comprises a fingerprint memory for storing a number of datasets, each dataset relating to data of a specific user.

4. The apparatus of claim 1, wherein the ultrasonic sensor is arranged behind a glass panel or a metal cover of the housing.

5. The apparatus of claim 1, wherein the ultrasonic sensor is located underneath the housing.

6. The apparatus of claim 1, wherein the measurement apparatus is a portable measurement apparatus.

7. A method for controlling a measurement apparatus, the measurement apparatus comprising a measuring device for receiving a measurement signal and/or for outputting a test signal, a user interface and an ultrasonic sensor for receiving user input, wherein the measuring device, the user interface and the ultrasonic sensor are accommodated in a common housing, the method comprising:
detecting a user input by the ultrasonic sensor, wherein detecting a user input comprises detecting a fingerprint of a user for identifying the user; and
controlling the measurement apparatus in response to the received user input, comprising:
switching on and off the measurement apparatus by a switch of the ultrasonic sensor when the ultrasonic sensor detects a fingerprint of a user;
storing user specific measurement data and/or user specific configuration data of the measuring device in a configuration memory of the ultrasonic sensor,
initializing the measurement apparatus based on the user specific measurement data and/or the user specific configuration data when the received user input relates to an identified user; and
initializing the measurement apparatus in a default mode if the received user input does not relate to an identified user.

8. The method of claim 7, wherein the housing shields the measuring device and the user interface against electromagnetic interferences.

9. The method of claim 7, comprising the step of storing a number of datasets in a fingerprint memory of the ultrasonic sensor, wherein each dataset relates to data of a specific user.

10. The method of claim 7, wherein the ultrasonic sensor is arranged behind a glass panel or a metal cover of the housing.

11. The method of claim 7, wherein the ultrasonic sensor is located underneath the housing.

12. The method of claim 7, wherein the measurement apparatus is a portable measurement apparatus.

* * * * *